United States Patent [19]

Libby

[11] Patent Number: 4,764,873
[45] Date of Patent: Aug. 16, 1988

[54] PATH BLOCKAGE DETERMINATION SYSTEM AND METHOD

[75] Inventor: Vibeke Libby, San Mateo, Calif.

[73] Assignee: Dalmo Victor, Inc., Div. of The Singer Company, Belmont, Calif.

[21] Appl. No.: 14,368

[22] Filed: Feb. 13, 1987

[51] Int. Cl.⁴ .................. G06F 15/46; G06F 15/50
[52] U.S. Cl. .................. 364/461; 364/474; 364/513
[58] Field of Search .................. 364/474, 513, 461

[56] References Cited

U.S. PATENT DOCUMENTS

| | | | |
|---|---|---|---|
| 3,781,530 | 12/1973 | Britland | 364/461 |
| 4,131,836 | 12/1978 | Noda | 364/474 X |
| 4,466,068 | 8/1984 | Deg e | 364/461 |
| 4,482,968 | 11/1984 | Inaba | 364/474 X |
| 4,489,377 | 12/1984 | Mawyer | 364/474 X |
| 4,651,601 | 3/1987 | Sasaki | 364/475 X |

*Primary Examiner*—Jerry Smith
*Assistant Examiner*—Steven Kibby
*Attorney, Agent, or Firm*—Flehr, Hohbach, Test, Albritton & Herbert

[57] ABSTRACT

A path analyzer for determining if a specified path is blocked by a given obstacle. A programmable comparator simultaneously compares each of the coordinates of a specified point in N dimensional space with two coordinate ranges: (1) the range defined by the minimum and maximum values of the coordinate for a specified obstacle, and (2) the range of values of that coordinate which are outside and one one side of the obstacle. As a result, the programmable comparator generates a 2N bit map signal denoting, for each coordinate, whether the specified point is within each of the two ranges.

The analyzer presents to the programmable comparator the coordinates of the starting point and the end point of a specified path, and the programmable comparator responds by generating a starting point map signal and an end point map signal. A decoder then uses these starting point and end point map signals to determine whether the specified path is blocked, not blocked, or may be blocked by the specified obstacle.

In a preferred embodiment, the decoder is a read only memory which generates a path analysis signal indicating whether the specified path is blocked, not blocked, or may be blocked. Furthermore, if the path may be blocked, the path analysis signal specified the calculation needed to resolve whether the specified path is blocked. In some embodiments a slope comparator is used to perform the calculations specified by the decoder to resolve whether the specified path is blocked.

7 Claims, 6 Drawing Sheets

FIG.—1

TWO DIMENSIONAL PATH ANALYSIS

TWO DIMENSIONAL PATH ANALYSIS
USING PROGRAMMABLE COMPARATOR

ROM DECODER PATTERN FOR DETECTING OBSTRUCTED PATHS

| A   B → | C1 | C2 | C3 | C4 | S1 | S2 | S3 | S4 | OB | * |
|---|---|---|---|---|---|---|---|---|---|---|
| C1 00 00 | N | N | M5 | N | N | M2 | M4* | N | B | E |
| C2 00 01 | N | N | N | M6 | N | N | M3 | M1* | B | E |
| C3 00 11 | M5* | N | N | N | M2* | N | N | M4 | B | E |
| C4 00 10 | N | M6* | N | N | M1 | M3* | N | N | B | E |
| S1 01 00 | N | N | M2 | M1* | N | M2 | H | M1* | B | E |
| S2 10 01 | M2* | N | N | M3 | M2* | N | M3 | H | B | E |
| S3 01 10 | M4 | M3* | N | N | H | M3* | N | M4 | B | E |
| S4 10 00 | N | M1 | M4* | N | M1 | H | M4* | N | B | E |
| OB 11 00 | A | A | A | A | A | A | A | A | AB | E |
| * | E | E | E | E | E | E | E | E | E | E |

KEY: N - No hit, path unobstructed
   H - Hit, path obstructed
   E - Error, faulty input data
   A - Path eminates from within obstruction
   AB- Path eminates from and ends within obstruction
   Mi- Path may or may not be obstructed To resolve ambiguity:
i=1-4  - test slope AVi   AB
i=1-4* - test slope AVi   AB
i=5    - test path to see if it crosses diagonal line $X_1,Y_2 - X_2,Y_1$
       - test slope AV2   slope AB and slope AV4   slope AB
i=5*   - test path to see if it crosses diagonal line $X_1,Y_2 - X_2,Y_1$
       - test slope AV2   slope AB and slope AV4   slope AB
i=6    - test path to see if it crosses diagonal line $X_1,Y_1 - X_2,Y_2$
       - test slope AV3   slope AB and slope AV1   slope AB
i=6*   -test path to see if it crosses diagonal line $X_1,Y_1 - X_2,Y_2$
       - test slope AV3   slope AB and slope AV1   slope AB

FIG. — 4

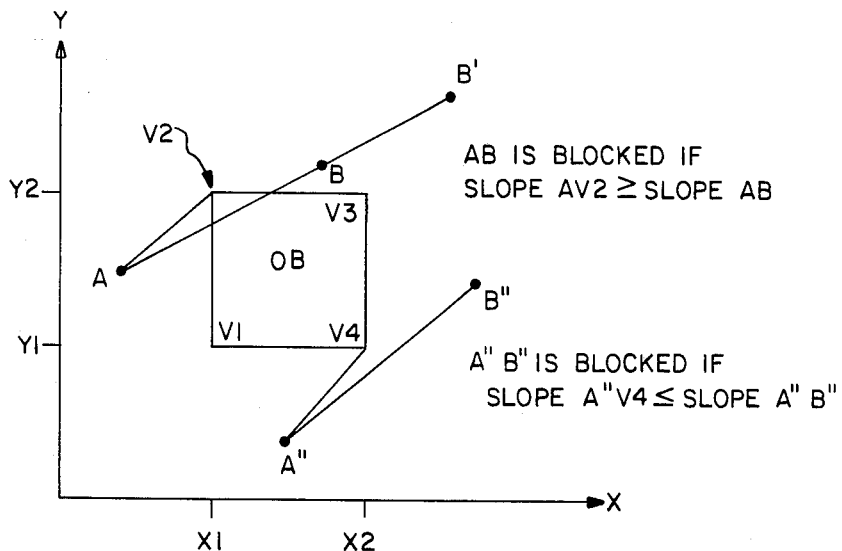
FIG. —5A
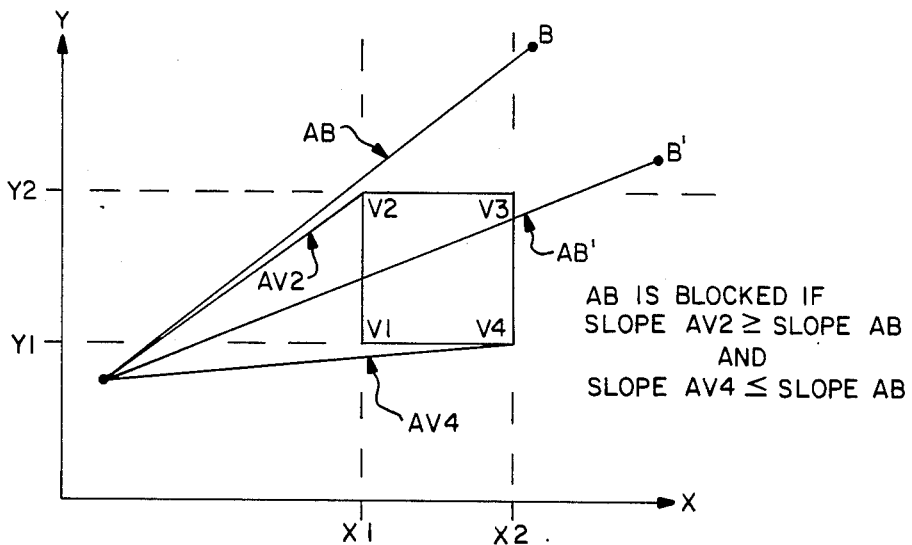
FIG. —5B

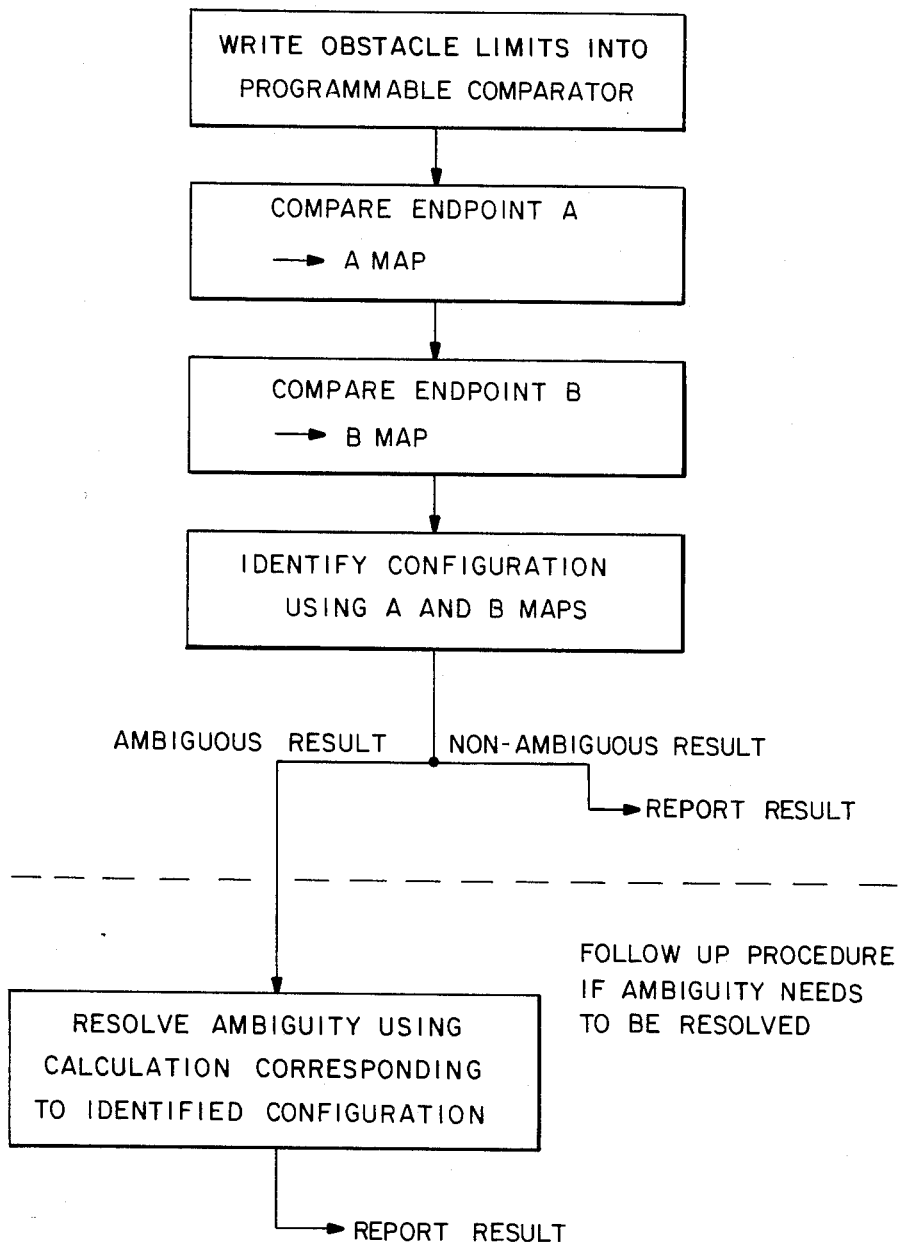
FIG. —6

PATH BLOCKAGE DETERMINATION SYSTEM AND METHOD

The present invention relates generally to systems and methods for determining if a specified path is blocked by a specified object, and particularly to systems for solving path blockage prediction problems at very high speed.

BACKGROUND OF THE INVENTION

There are numerous circumstances in which it is useful to determine if a specified path is blocked by a specified obstacle. For example, in robotics, the system may need to find a clear path through a known terrain to a specified destination. This would apply equally well to a fixed position robot with a moveable arm as to a moveable robot.

Other applications include checking an airplane's proposed trajectory against a known terrain and/or set of obstacles, and hidden line calculations for video display systems.

The present invention provides a fast solution to the question: does a given line in space intersect a given volume? Alternately, the invention can be used to generate a representation of the relationship between two points and a given volume, thereby providing data for selecting one of a number of possible subsequent calculations.

In the prior art known to the inventor, path blockage analysis requires a series of mathematical calculations performed by a computer using an algorithm specified by a computer program. In both two and three dimensional situations this requires numerous computer clock cycles.

In the present invention, the processing time required for three dimensional path analyses is the same as for two dimensional analyses. What differs is the amount of hardware needed. In the prior art, the time required for three dimensional analyses increases exponentially with the number of dimensions. Thus the higher the dimension of the path analyses, the greater the advantage provided by this invention.

The present invention analyzes the relationship between a path and an obstacle (also referred to as an object) by performing a set of comparisons without performing any mathematical calculations. By performing this analysis using dedicated hardware to simultaneously perform the comparisons, and also to decode the results of the comparisons, instead of performing a series of calculations in a computer, the amount of time required to perform the analysis can be substantially reduced.

In some circumstances, the result of the initial comparison analysis performed by the invention will be ambiguous—i.e., the result of the analysis will be that the specified path may or may not be blocked by the specified object. Sometimes the ambiguous result will be all that is needed. For instance, a system incorporating the invention may be looking at several possible paths and will select the first unambiguously clear path. In some circumstances a system incorporating the invention might reject clearly blocked paths but accept paths which involve some risk of being blocked.

In some embodiments of the invention, the system will resolve ambiguities resulting from the initial path analysis by performing a set of calculations which eliminate the ambiguity. The information resulting from the initial path analysis is used to determine the calculations needed to resolve the ambiguity, thereby reducing the number of calculations needed to determine if the specified object blocks the specified path.

It is therefore a primary object of the present invention to provide a path blockage analysis system and method which performs its analysis substantially faster than it would take a conventional computer to perform the same analysis.

Another object of the present invention is to provide a path blockage analysis system which simultaneously performs a set of predefined comparisons to determine the relationship between a specified path and a given obstacle.

SUMMARY OF THE INVENTION

In summary, the present invention is a path analyzer for determining if a specified path is blocked by a given obstacle. The path analyzer uses a programmable comparator to simultaneously compare each of the coordinates of a specified point in N dimensional space with two coordinate ranges: (1) the range defined by the minimum and maximum values of that coordinate for a specified obstacle, and (2) the range of values of that coordinate which are outside and on one side of the obstacle. As a result, the programmable comparator generates a map signal having 2N bits for denoting whether the specified point is within each of the two ranges for each coordinate.

The programmable comparator performs these comparisons for both the starting point and the end point of a specified path, thereby generating a starting point map signal and an end point map signal. A decoder then decodes these map signals to determine whether the specified path is blocked, not blocked, or may be blocked by the specified obstacle.

In a preferred embodiment, the decoder is a read only memory which uses the map signals as an address signal. The contents of the memory at this address is a path analysis signal indicating whether the specified path is blocked, not blocked, or may be blocked. Furthermore, if the path may be blocked, the path analysis signal specifies the calculation needed to resolve whether the specified path is blocked. In some embodiments a slope comparator is used to perform the calculations specified by the decoder to resolve whether the specified path is blocked.

BRIEF DESCRIPTION OF THE DRAWINGS

Additional objects and features of the invention will be more readily apparent from the following detailed description and appended claims when taken in conjunction with the drawings, in which:

FIG. 4 depicts the ROM decoder pattern used to detect obstructed paths in a two dimensional path analysis.

FIGS. 5A and 5B depict the angular relationships used, in a two dimensional path analysis, to resolve ambiguous results from an initial path analysis.

FIG. 6 is a flow chart of the method of the present invention.

DESCRIPTION OF THE PREFERRED EMBODIMENT

Figure 1:
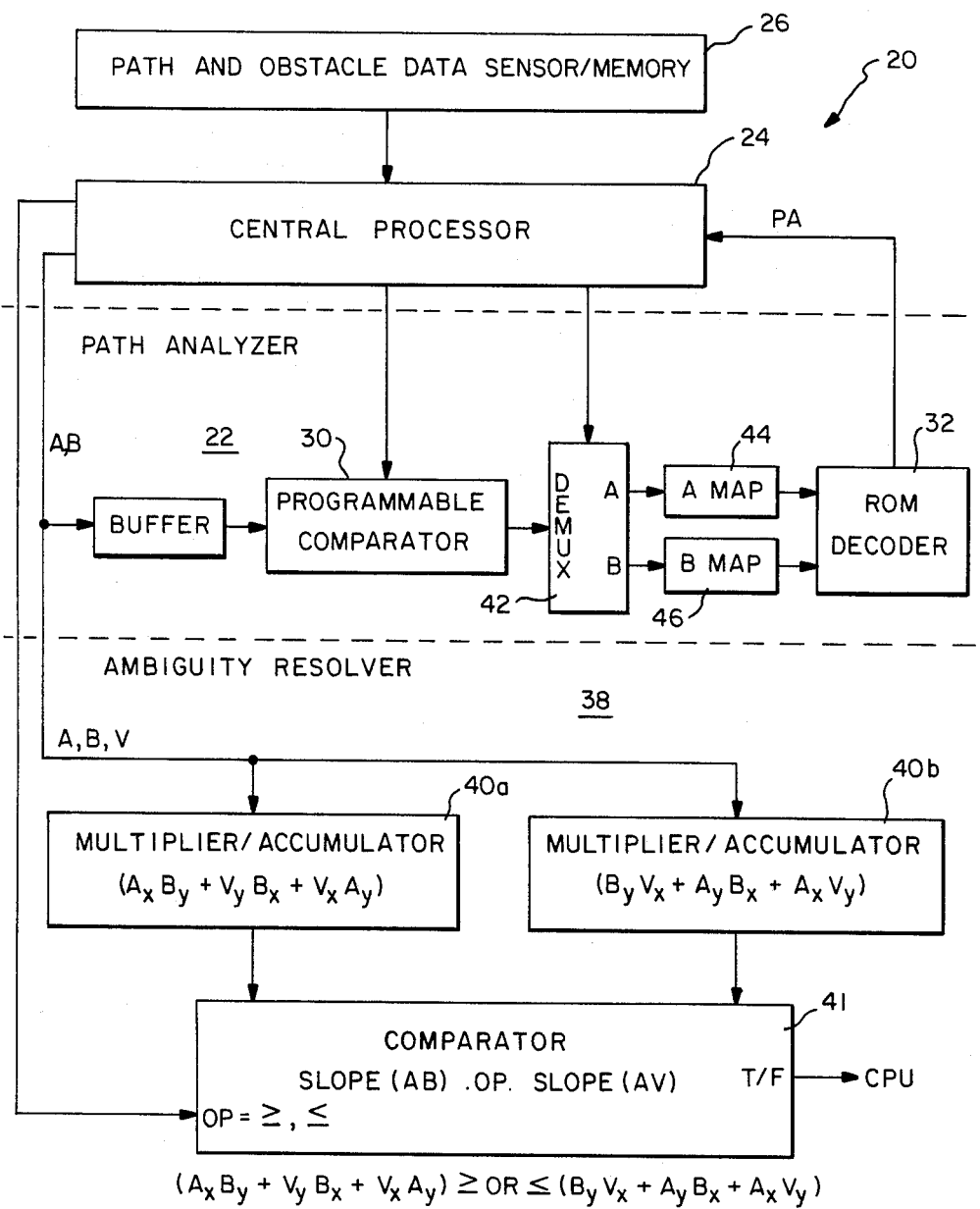
FIG. 1 is a block diagram of a computer system incorporating the present invention.

Referring to FIG. 1, there is shown a computer system 20 incorporating a path analyzer 22 in accordance with the present invention. For the purposes of the initial description of the preferred embodiment, it will be assumed that the computer system 20 is trying to determine if a specified two dimensional path is obstructed by a specified two dimensional obstacle. For instance, the computer system may be a robot trying to move itself from its current location to a specified destination without hitting a specified obstacle.

The use of the invention for analyzing three dimensional paths, and N dimensional paths, will be described after the two dimensional situation has been described.

As in most computer systems, there is a central processor (CPU) 24 which is programmed to perform various tasks. As will be described in detail, the path analyzer 22 is used by the CPU as a compressor, much in the same way as math coprocessors are used in many computer systems.

The computer system 20 will also include a memory or some other peripheral equipment 26 for specifying or representing the paths and obstacles to be analyzed. Typically, the obstacles will be specified by a map (stored in the computer's memory or on a storage medium such as a magnetic disk) covering the relevant terrain, and the paths will be specified by the task that the system 20 is programmed to perform. Thus the peripheral 26 will typically be a memory device. However, the path and obstacle data could come from optical or other sensors.

The CPU uses the path analyzer 22 by using a programmable comparator 30 to compare the end points of a specified path with data corresponding to the coordinates of a specified obstacle. This generates two map signals which are then decoded by a decoder 32 to produce a path analysis signal PA, which indicates whether the obstacle blocks the specified path. The operation of the programmable comparator is described below with reference to FIG. 3.

As will be explained in more detail below, the path analyzer 22 will often produce ambiguous results. That is, in some circumstances the path analysis signal will indicate that the path may or may not be blocked. The path analyzer is nevertheless useful because it does produce an unambiguous answer in many situations, and because even ambiguous results are useful in many situations. Furthermore, the path analyzer 22 can be set up to specify the calculations that need to be performed to resolve an ambiguous result, thereby reducing the number of calculations that need to be performed to determine if a specified path is blocked by a specified obstacle. Note, however, that in one dimensional path analyses, there are no ambiguities to be resolved—the initial path analysis will always determine if the path is blocked or unblocked.

In one embodiment, the path analyzer 22 includes a slope comparator 38 which can perform the calculations needed to resolve ambiguous path analyses much faster than a general purpose central processor 24.

Figure 2:
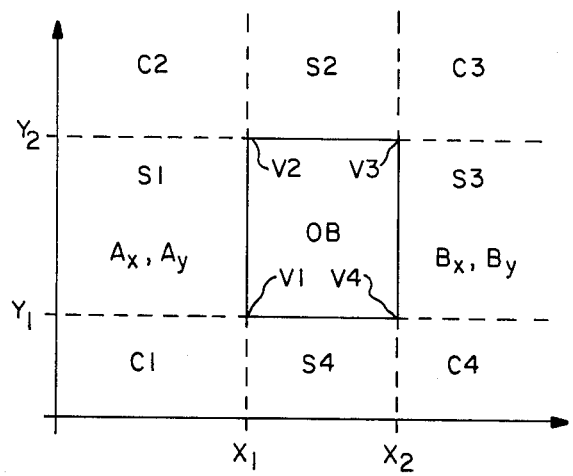
FIG. 2 is graphical representation of a two dimensional path blockage analysis.

Referring to FIG. 2, there is shown a graphical representation of a two dimensional path AB and a two dimensional obstacle OB. As shown, the obstacle is bounded on the X axis by $X_1$ and $X_2$, and it is bounded on the Y axis by $Y_1$ and $Y_2$.

Surrounding the obstacle OB are four corner regions C1–C4, and four side regions S1–S4. The four vertices of the obstacle are labelled V1–V4.

As can be easily seen in this two dimensional example, if the path AB starts in region S1 and ends in region S3, the path will be blocked by the obstacle. Similarly if AB goes from C1 to C2, it will definitely not be blocked. However, if AB goes from C1 to S2, or from S1 to S2, or from S1 to C3, then the path may or may not be blocked. Given a random distribution of A and B, it can be seen that the set of possible AB paths can be categorized into three subsets: definitely unblocked, definitely blocked, and may be blocked.

The present invention analyzes paths using a set of mathematical comparisons corresponding to the regions shown in FIG. 2, so that any paths can be categorized as unblocked, blocked, or may be blocked.

Figure 3:
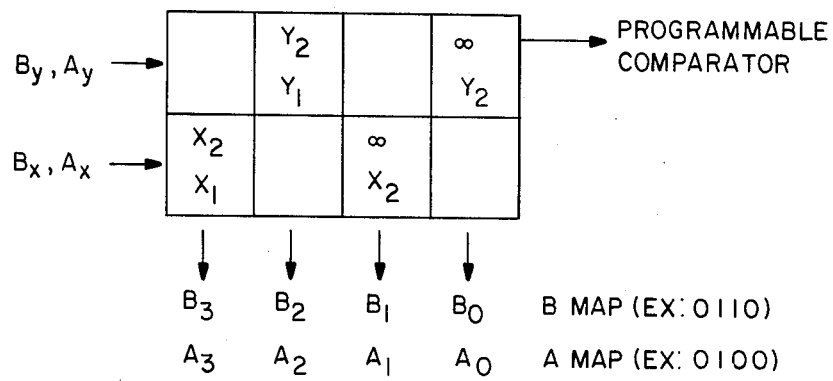
FIG. 3 is a schematic representation of how a programmable comparator is used in the preferred embodiment to analyze a two dimensional path.

FIG. 3 is a schematic representation of how a programmable comparator is used in the preferred embodiment to analyze a two dimensional path. The programmable comparator is preferably the Associative Comparator made by IBM or the VHSIC Window Addressable Memory (part number 1HC31) made by TRW. Regardless of the component or components used, the programmable comparator must be able to simultaneously test a number (such as the X coordinate of a point in space) against two or more value ranges.

In the preferred embodiment, for a two dimensional path, the X and Y coordinates of the path's starting point A and ending point B are tested as follows. Each coordinate is tested to see if it is (1) in the range of values defined by the minimum and maximum values of that coordinate for the obstacle, or (2) in the range of values of that coordinate which are outside and on one side of said obstacle.

Thus the X coordinate (e.g., $A_x$) is tested to see if it is between $X_1$ and $X_2$, and also to see if it is between $X_2$ and the maximum value possible for an X coordinate (denoted as $\infty$ in FIG. 3).

As shown in FIG. 3, each coordinate is tested against two ranges. If the coordinate is within the test range, a binary 1 is generated, otherwise a 0 is generated. Thus a four bit binary map signal is generated for each point A and B, and these are called the A map and B map.

At this point it should be noted that for each point a four bit map signal is generated. Thus is would appear that the map signal could have sixteen ($2^4$) different values. However, as shown in FIG. 2, there are only nine regions (OB, C1–C4, and S1–S4) used to identify the location of a point. Therefore seven of the potential map values are not used—and are interpreted as an error if such a value is detected.

Referring to FIG. 1, the programmable comparator 30 is used by first programming four comparators or "windows" with values corresponding to the minimum and maximum values of each coordinate for the specified obstacle OB. Then, in two successive steps, point A is tested and then point B is tested. In other words, both coordinates $A_x$ and $A_y$ are simultaneously processed in one step, and then coordinates $B_x$ and $B_y$ are processed in a second step. Thus, once the programmable comparator 30 is programmed with the data for a particular obstacle, it takes only two "cycles" to process both end points of a path.

A demultiplexer 42 is used to route the A and B maps to two latches 44 and 46, which present the map signals to a read only memory (ROM Decoder 32) as an address.

FIG. 4 depicts the ROM decoder pattern used to detect obstructed paths in a two dimensional path analysis. The map signal for each of the nine regions is shown, and the last row and column are labelled with an asterisk "*" to indicate that all other map signal values are interpreted as an error.

The output from the ROM Decoder 32 is represented in FIG. 4 using symbols that indicate whether the path is obstructed (H), unobstructed (N), emanates from and/or ends within the obstacle (A and/or B), or may be obstructed (M). Please refer to the key in FIG. 4. Also, if the path may be obstructed, the calculation needed to determine if the path is obstructed is specified. This will be explained in more detail below with reference to FIG. 5.

In one embodiment of the invention, the output from the ROM 32 is an eight bit path analysis signal structured as:

| bit: | 7 | 6 | 5 | 4 | 3–0 |
|------|---|---|---|---|-----|
|      | N | H | A | B | Mi  | where, for may be obstructed paths, the "i" in "Mi" indicates the calculation needed to determine if the path is obstructed.

It is assumed in this embodiment that only legal map signals will be used to address the ROM 32.

Referring to FIGS. 5A and 5B, there are basically two situations in which the programmable comparator 30 will produce an ambiguous result: (1) when the path AB goes from one side region to a second side region such as from S1 to S2, or when the path goes between a side region such as S1 and a corner region such as C3, and (2) when the path AB goes from one corner to another such as C1 to C3.

As can be seen from FIG. 5A, the side-side and the side-corner situations are similar in that the ambiguity can be resolved by comparing the slope of path AB with the slope from point A to a properly selected vertex Vi of the obstacle OB. Referring to FIG. 4, the output of the ROM 32 is Mi for these situations, where "i" indicates the vertex that needs to be used for the calculation.

As noted in the key at the bottom of FIG. 4, the "i" also indicates the polarity of the comparison. Looking at FIG. 5A, it can be seen that the polarity of the comparison depends on the relative positions of the line AB and the obstacle OB (i.e., it depends on the configuration as identified by the A and B map signals). In all the possible configurations it is clear that if A and B are located differently, but in the same basic geometrical configuration with respect to the obstacle, then the solution will remain the same, although the direction of the inequality will change.

FIG. 5B shows that when a path goes from one corner region to an opposing corner region, two slope comparisons must be made to determine if the path is blocked.

The equations for comparing two slopes (AB vs. AV) are as follows:

$$\text{Slope}(AV) \geq \text{or} \leq \text{Slope}(AB)$$

$$\text{Slope}(AV) = \frac{V_y - A_y}{V_x - A_x}$$

$$\text{Slope}(AB) = \frac{B_y - A_y}{B_x - A_x}$$

$$V_y B_x + V_x A_y + A_x B_y \geq \text{or} \leq V_x B_y + A_y B_x + A_x V_y$$

This calculation can be performed at very high speeds using a pair of multiplier accumulator (MAC) chips 40a and 40b (such as the VHSIC Multiplier Accumulator Chip, part number 1HC37, made by TRW) and a comparator 41 as shown in FIG. 1. Other equivalent circuitry could be used to perform these calculations, but the TRW component is preferred because it can multiply and accumulate a pair of sixteen bit numbers in approximately sixty to one hundred nanoseconds.

For the two dimensional slope comparison discussed above, the first MAC 40a would successively multiply and accumulate $V_y B_x$, $V_x A_y$, and $A_x B_y$, while the second MAC 40b multiplies and accumulates $V_x B_y$, $A_y B_x$, and $A_x V_y$. Using two MAC chips working in parallel, the slope comparison calculation takes three clock cycles.

FIG. 6 is a flow chart of the method of the invention. As discussed above, the configuration is initially analyzed in two clock cycles by using a programmable comparator to map the relationship of each end of a specified path with respect to a specified obstacle. Each end point is analyzed in just one clock cycle by performing all of the obstacle related comparisons simultaneously. Then the resulting A and B map signals are decoded to identify the configuration of the specified path with respect to the obstacle.

If the identified configuration corresponds to a blocked or unblocked path, then the analysis of the path is done. Otherwise, if the configuration corresponds to a path which may be blocked, and an ambiguous result is not permitted, this ambiguity can be resolved using the calculations corresponding to the identified configuration, as discussed above.

Three Dimensional Path Analysis

While only a two dimensional path analysis was discussed above, the present invention is equally applicable to three dimensional, or even N dimensional, path analyses.

Figure 7:
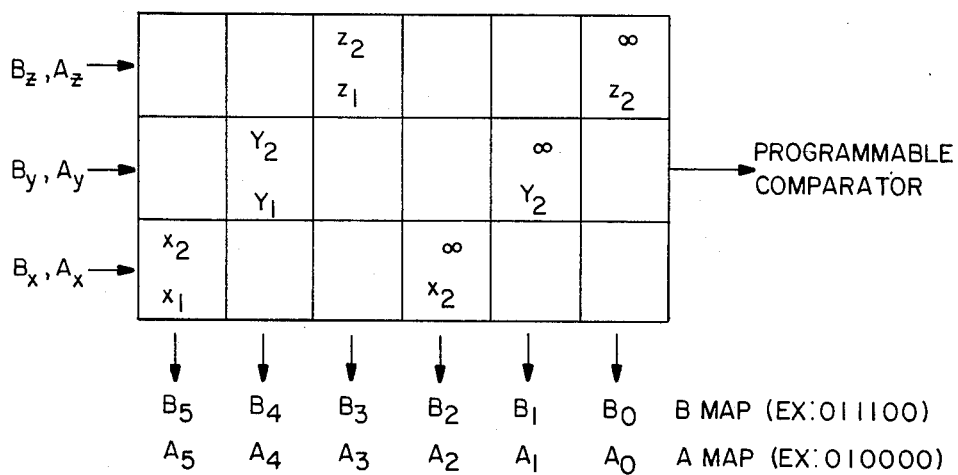
FIG. 7 shows how a programmable comparator is used to analyze a three dimensional path.

FIG. 7 shows how a programmable comparator is used to analyze a three dimensional path. As can be seen, the initial configuration analysis is basically the same, except that a six bit map is generated for each endpoint of the specified path because three coordinates (x, y, and z) must now be compared with the corresponding two coordinate ranges corresponding to the boundaries of the specified obstacle.

Figure 8:
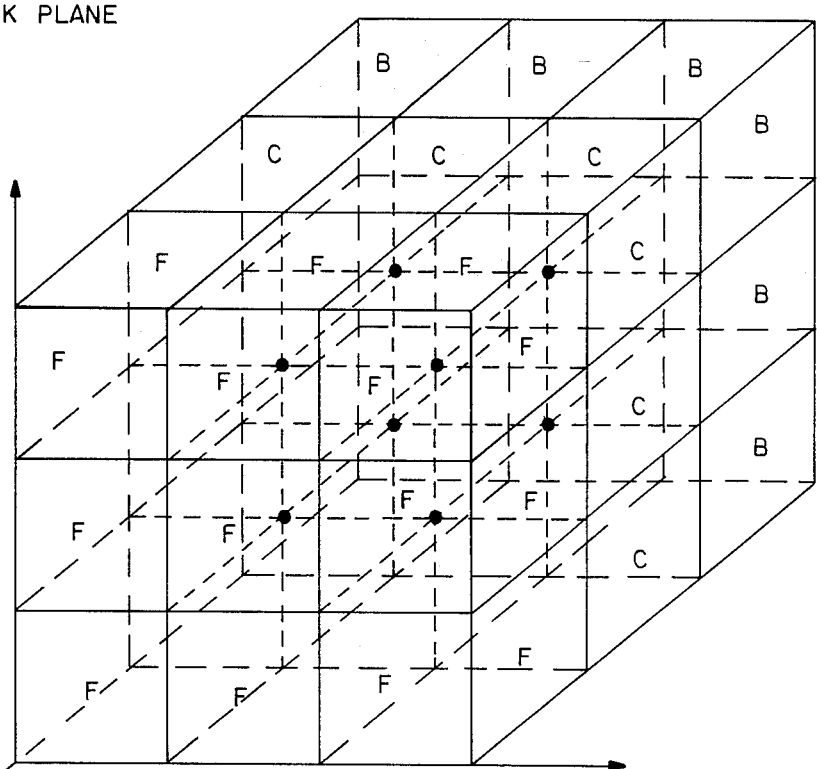
FIG. 8 depicts the regions used to analyze three dimensional paths.

Referring to FIG. 8, for the purposes of a three dimensional path analysis there are 27 different regions in which each point can be located. The obstacle, the eight corners of which are marked with heavy dots, is in the middle. The nine regions in the front "plane" are marked with F's, the center regions are marked with C's and the back regions are marked with B's.

As with the two dimensional case, the resulting map signals contain redundant information: since there are only twenty-seven regions, only twenty-seven of the sixty-four possible values of each 6-bit map signal are actually used.

Similarly, the A and B map signals can be decoded using a read only memory, or equivalent decoder mechanism, to determine if the path is blocked, unblocked, or may be blocked. Generating the three dimensional decoder pattern (similar to, but larger than, the decoder pattern shown in FIG. 4) is a straightforward, although laborious, task. Also, some of the calculations for resolving ambiguities are clearly more complex in the three dimensional case, but the approach is the same. The number of comparisons needed, as well as the polarity of each such comparison, will depend on the identified configuration. For configurations where the specified path AB is entirely within one of the coordinate ranges (e.g., within $X_1$ to $X_2$), the comparisons needed will be the same as for the two dimensional case discussed above.

Further, the processing time required for three dimensional path analyses is the same as for two dimensional analyses. What differs is the amount of hardware needed. In the prior art, the time required for three dimensional analyses increases exponentially with the number of dimensions. Thus the higher the dimension of the path analyses, the greater the advantage provided by this invention.

Nonrectangular Obstacles

While the obstacles shown in the Figures are rectangular, it will be clear to those skilled in the art that more complexly shaped obstacles can be either (1) approximated as a rectangular obstacle, especially for the purpose of a preliminary analysis which avoids unnecessary calculations for unobstructed paths, and/or (2) modelled as a set of adjacent or even overlapping rectangular obstacles, where the specified path will be blocked if any one of the rectangular obstacles in this set blocks the path.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A path analyzer, comprising
   programmable comparator means for simultaneously comparing each of the coordinates of a specified point in N dimensional space, where N is the number of coordinates used to define the location of each said point, with two coordinate ranges:
   (1) the range of values within the range defined by the minimum and maximum values of said coordinate for a specified obstacle, and
   (2) the range of values of said coordinate which are outside and on one side of said obstacle;
   said programmable comparator generating a map signal, having 2N bits, denoting for each of said N coordinates whether the specified point is within each of said two ranges;
   path denoting means for simultaneously presenting to said programmable comparator N coordinates of a specified starting point of a specified path in N-dimensional space so that said programmable comparator generates a starting point map signal, and for simultaneously presenting to said programmable comparator N coordinates of the end point of said specified path in N-dimensional space so that said programmable comparator generates an end point map signal; and
   decoder means for decoding said starting point map signal and end point map signal and generating a path analysis signal which specifies one of three path conditions selected from the group comprising: blocked (said specified path is blocked by said specified obstacle), unblocked (said specified path is not blocked by said specified obstacle), and maybe-blocked (said specified path may be blocked by said specified obstacle).

2. The path analyzer of claim 1, wherein said decoder means is a memory using said starting point map signal and end point map signal together as an address, the output of said memory being said path analysis signal.

3. The path analyzer of claim 1 or 2, wherein
   when said decoder generates a path analysis signal indicating that said specified path may-be-blocked, said path analysis signal further specifies the calculation needed to determine whether said specified path is blocked by said obstacle.

4. The path analyzer of claim 3, further including
   slope comparison means for comparing the slope of said path with the slope of a line defined by a specified one of the end points of said path and a specified point on the periphery of said obstacle, and for generating a slope comparison signal indicating whether said comparison passed a specified test; and
   processing means for supplying said slope comparison means with the coordinates of said starting and end points of said path, and the coordinates of a point on the periphery of said obstacle selected in accordance with said calculation indicated by said path analysis signal;
   said processing means including means for receiving the comparison signal generated by said slope comparison means;
   whereby said processing means can use said slope comparison means to perform the calculations necessary to determine if a path is blocked when said path analysis signal indicates that said path may be blocked.

5. In a method of determining whether a specified path is blocked by a specified obstacle, said path having specified first and second end points in N dimensional space, where N is the number of coordinates used to define the location of each said point, the steps comprising:
   simultaneously comparing each of the coordinates of said first end point with two coordinate ranges:
   (1) the range of values within the range defined by the minimum and maximum values of said coordinate for a specified obstacle, and
   (2) the range of values of said coordinate which are outside and on one side of said obstacle,
   and generating a first map signal, having 2N bits, denoting for each of said N coordinates whether said first end point is within each of said two ranges;
   simultaneously comparing each of the coordinates of said second end point with said two coordinate ranges and generating a second map signal, having 2N bits, denoting for each of said N coordinates whether said second end point is within each of said two ranges;

decoding said first and second map signals in accordance with a predetermined decoding pattern and thereby generating a path analysis signal which specifies one of three path conditions selected from the group comprising: blocked (said specified path is blocked by said specified obstacle), unblocked (said specified path is not blocked by said specified obstacle), and may-be-blocked (said specified path may be blocked by said specified obstacle).

6. The path analysis method of claim 5, wherein when said path may-be-blocked, said decoding step includes the step of generating a signal that specifies a follow-up calculation for determining whether said specified path is blocked by said obstacle.

7. The path analysis method of claim 6, further including the step of performing said follow-up calculation, said performing step including the steps of:
   selecting a point on the periphery of said obstacle in accordance with said specified follow-up calculation;
   selecting a comparison test in accordance with said specified follow-up calculation; and
   comparing the slope of said path with the slope of a line defined by a specified one of the end points of said path and said selected point on the periphery of said obstacle, and generating a slope comparison signal indicating whether said comparison passed said selected test.

* * * * *